(12) United States Patent
Lei et al.

(10) Patent No.: US 12,707,782 B2
(45) Date of Patent: Aug. 11, 2026

(54) WIRING SUBSTRATE AND METHOD FOR PREPARING SAME, LIGHT-EMITTING SUBSTRATE, AND DISPLAY DEVICE

(71) Applicants: Hefei BOE Ruisheng Technology Co., Ltd., Hefei (CN); BOE Technology Group Co., Ltd., Beijing (CN)

(72) Inventors: Jie Lei, Beijing (CN); Jian Tian, Beijing (CN); Chunjian Liu, Beijing (CN); Jianying Zhang, Beijing (CN); Yajun Ma, Beijing (CN); Jiawei Xu, Beijing (CN)

(73) Assignees: Hefei BOE Ruisheng Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 423 days.

(21) Appl. No.: 18/270,845

(22) PCT Filed: Aug. 29, 2022

(86) PCT No.: PCT/CN2022/115604
§ 371 (c)(1),
(2) Date: Jul. 4, 2023

(87) PCT Pub. No.: WO2024/044912
PCT Pub. Date: Mar. 7, 2024

(65) Prior Publication Data

US 2024/0379920 A1 Nov. 14, 2024

(51) Int. Cl.
*H10H 20/857* (2025.01)
*H10D 86/00* (2025.01)
(Continued)

(52) U.S. Cl.
CPC .......... *H10H 20/857* (2025.01); *H10W 90/00* (2026.01); *H10H 20/0364* (2025.01)

(58) Field of Classification Search
CPC .............. H10H 20/857; H10H 20/0364; H01L 25/0753; H10D 86/00; H10K 59/1315
See application file for complete search history.

(56) References Cited

U.S. PATENT DOCUMENTS

2021/0175282 A1* 6/2021 Ikeda .................. G06F 3/04166

FOREIGN PATENT DOCUMENTS

| | | |
|---|---|---|
| CN | 109309101 A | 2/2019 |
| CN | 110164879 A | 8/2019 |
| CN | 112735262 A | 4/2021 |

* cited by examiner

*Primary Examiner* — Antonio B Crite
(74) *Attorney, Agent, or Firm* — IPro, PLLC

(57) ABSTRACT

Provided is a wiring substrate. The wiring substrate includes: a base, including a functional region, a bonding region, and a connecting region; a first conductive layer, disposed on a side of the base and in the functional region and the connecting region; a first insulative layer, disposed on a side of the first conductive layer and in the functional region, the connecting region, and the bonding region, wherein a first via is defined in a portion of the first insulative layer and is configured to expose the first conductive layer; a second conductive layer, disposed on a side of the first insulative layer and in the connecting region and the bonding region, and electrically connected to the first conductive layer; and a second insulative layer, disposed on a side of the second conductive layer and in the connecting region and the functional region.

20 Claims, 10 Drawing Sheets

(51) Int. Cl.

| | |
|---|---|
| ***H10H 20/01*** | (2025.01) |
| ***H10H 20/812*** | (2025.01) |
| ***H10W 90/00*** | (2026.01) |

WIRING SUBSTRATE AND METHOD FOR PREPARING SAME, LIGHT-EMITTING SUBSTRATE, AND DISPLAY DEVICE

CROSS-REFERENCE TO RELATED APPLICATIONS

This application is a U.S. national stage of international application No. PCT/CN2022/115604, filed on Aug. 29, 2022, the disclosure of which is incorporated herein by reference in its entirety.

TECHNICAL FIELD

The present disclosure relates to the field of display technologies, and in particular, relates to a wiring substrate and a method for preparing the same, a light-emitting substrate, and a display device.

BACKGROUND OF THE INVENTION

Liquid crystal display devices have been widely used due to advantages, such as thin, great shock resistance, a wide view angle, and a high contrast. The liquid crystal display device generally includes a display substrate and a back light source, and the back light source is generally disposed on a non-display side of a display panel to provide a light source to the display panel. The contrast, a luminance uniformity, a stability, and the like of the liquid crystal display device are associated with a structure and property of the back light source. Recently, a mini light-emitting diode (Mini-LED) has been widely attended due to excellent property, and are increasingly used in the back light source.

SUMMARY OF THE INVENTION

Embodiments of the present disclosure provide a wiring substrate and a method for preparing the same, a light-emitting substrate, and a display device. The technical solutions are as follows.

In some embodiments of the present disclosure, a wiring substrate is provided. The wiring substrate includes:

- a base, including a functional region, a bonding region, and a connecting region between the functional region and the bonding region;
- a first conductive layer, disposed on a side of the base and in the functional region and the connecting region;
- a first insulative layer, disposed on a side, distal from the base, of the first conductive layer and in the functional region, the connecting region, and the bonding region, wherein a first via is defined in a portion, disposed in the connecting region, of the first insulative layer and is configured to expose the first conductive layer;
- a second conductive layer, disposed on a side, distal from the base, of the first insulative layer and in the connecting region and the bonding region, and electrically connected to the first conductive layer via the first via; and
- a second insulative layer, disposed on a side, distal from the base, of the second conductive layer and in the connecting region and the functional region.

In some embodiments, the first insulative layer includes a first insulative sub-layer and a second insulative sub-layer that are sequentially laminated along a direction away from the base, the first via includes a first sub via in the first insulative sub-layer and a second sub via in the second insulative sub-layer, and

- the second conductive layer is electrically connected to the first conductive layer via the first sub via and the second sub via.

In some embodiments, the wiring substrate further includes: a planarization layer between the first insulative sub-layer and the second insulative sub-layer, wherein

- the planarization layer is disposed in the functional region, the connecting region, and the bonding region, and a second via is defined in a portion, disposed in the connecting region, of the planarization layer;
- wherein the first sub via, the second via, and the second sub via are configured to expose the first conductive layer, the second conductive layer is electrically connected to the first conductive layer via the first sub via, the second via, and the second sub via.

In some embodiments, the wiring substrate further includes: a planarization layer between the first insulative sub-layer and the second insulative sub-layer, wherein

- the planarization layer is disposed in the functional region, and is not disposed in the connecting region and the bonding region.

In some embodiments, the first conductive layer includes a plurality of functional electrodes, and the second conductive layer includes a plurality of bonding electrodes extending along a first direction and arranged along a second direction, wherein the first direction is an arrangement direction of the functional region, the connecting region, the bonding region, and the second direction is intersected with the first direction, and

- an end, proximal to the functional region in the first direction, of each of the plurality of bonding electrodes is electrically connected to an end, proximal to the bonding region in the first direction, of each of the plurality of functional electrodes via the first via.

In some embodiments, the first insulative layer includes a target face facing away from the base, wherein a distance between a portion, in the bonding electrode in the bonding region, of the target face and the base is equal to a distance between a portion, other than the portion in the bonding electrode in the bonding region, of the target face and the base.

In some embodiments, the end, proximal to the bonding region in the first direction, of each of the plurality of functional electrodes is electrically connected to ends, proximal to the functional region in the first direction, of one or more bonding electrodes.

In some embodiments, the second conductive layer further includes at least one dummy bonding electrode extending along the first direction, wherein the at least one dummy bonding electrode and the plurality of bonding electrodes are arranged along the second direction, and

- each of the at least one dummy bonding electrode is not electrically connected to the plurality of functional electrodes.

In some embodiments, the wiring substrate further includes: a buffer layer, wherein

- the buffer layer is disposed between the base and the first conductive layer.

In some embodiments of the present disclosure, a method for preparing a wiring substrate is provided. The method includes:

- providing a base, wherein the base includes a functional region, a bonding region, and a connecting region between the functional region and the bonding region;
- forming a first conductive thin film on a side of the base, and forming a first conductive layer by patterning the first conductive thin film by a first mask, wherein the first conductive layer is disposed in the functional region and the connecting region;

forming a first insulative thin film on a side, distal from the base, of the first conductive layer, and forming a first insulative layer by patterning the first insulative thin film by a second mask, wherein the first insulative layer is disposed in the functional region, the connecting region, and the bonding region, wherein a first via is defined in a portion, disposed in the connecting region, of the first insulative layer and is configured to expose the first conductive layer;

forming a second conductive thin film on a side, distal from the base, of the first insulative layer, and forming a second conductive layer by patterning the second conductive thin film by a third mask, wherein the second conductive layer is disposed in the connecting region and the bonding region, and is electrically connected to the first conductive layer via the first via; and forming a second insulative thin film on a side, distal from the base, of the second conductive layer, and forming a second insulative layer by patterning the second insulative thin film by a fourth mask, wherein the second insulative layer is disposed in the connecting region and the functional region.

In some embodiments, forming the first insulative layer includes:

forming a first insulative thin sub-film on the side, distal from the base, of the first conductive layer, and forming a first insulative sub-layer by patterning the first insulative thin sub-film by the second mask, wherein the first insulative sub-layer is disposed in the functional region, the connecting region, and the bonding region, wherein a first sub via is defined in a portion, disposed in the connecting region, of the first insulative sub-layer; and forming a second insulative thin sub-film on a side, distal from the base, of the first insulative thin sub-film, and forming a second insulative sub-layer by patterning the second insulative thin sub-film by the second mask, wherein the second insulative sub-layer is disposed in the functional region, the connecting region, and the bonding region, wherein a second sub via is defined in a portion, disposed in the connecting region, of the second insulative sub-layer, and an orthogonal projection of the second sub via on the base is at least partially overlapped with an orthogonal projection of the first sub via on the base.

In some embodiments, upon forming the first insulative sub-layer and prior to forming the second insulative sub-layer, the method further includes:

forming a bonding thin film on a side, distal from the base, of the first insulative sub-layer, and forming a planarization layer by patterning the bonding thin film by a fifth mask, wherein the planarization layer is disposed in the functional region, the connecting region, and the bonding region, and a second via is defined in a portion, disposed in the connecting region, of the planarization layer;

wherein the first sub via, the second via, and the second sub via are configured to expose the first conductive layer, the second conductive layer is electrically connected to the first conductive layer via the first sub via, the second via, and the second sub via.

In some embodiments, upon forming the first insulative sub-layer and prior to forming the second insulative sub-layer, the method further includes:

forming a bonding thin film on a side, distal from the base, of the first insulative sub-layer, and forming a planarization layer by patterning the bonding thin film by a fifth mask, wherein the planarization layer is disposed in the functional region, and is not disposed in the connecting region and the bonding region.

In some embodiments of the present disclosure, a light-emitting substrate is provided. The light-emitting substrate includes: a circuit board in a bonding region of a base, a plurality of light-emitting units on a functional region of a base, and the wiring substrate according to the above embodiments, wherein a first conductive layer in the wiring substrate is connected to the plurality of light-emitting units, and a second conductive layer in the wiring substrate is connected to the circuit board.

In some embodiments of the present disclosure, a display device is provided. The display device includes: a power supply assembly and the light-emitting substrate according to the above embodiments, wherein the power supply assembly is configured to supply power to the light-emitting substrate.

BRIEF DESCRIPTION OF DRAWINGS

For clearer description of the technical solutions in the embodiments of the present disclosure, the following briefly describes the accompanying drawings required for describing the embodiments. Apparently, the accompanying drawings in the following description show merely some embodiments of the present disclosure, and those of ordinary skill in the art may still derive other drawings from these accompanying drawings without any creative efforts.

DETAILED DESCRIPTION OF THE INVENTION

To make the objectives, technical solutions, and advantages of the present disclosure clearer, the embodiments of the present disclosure are further described in detail hereinafter with reference to the accompanying drawings.

Figure 1:
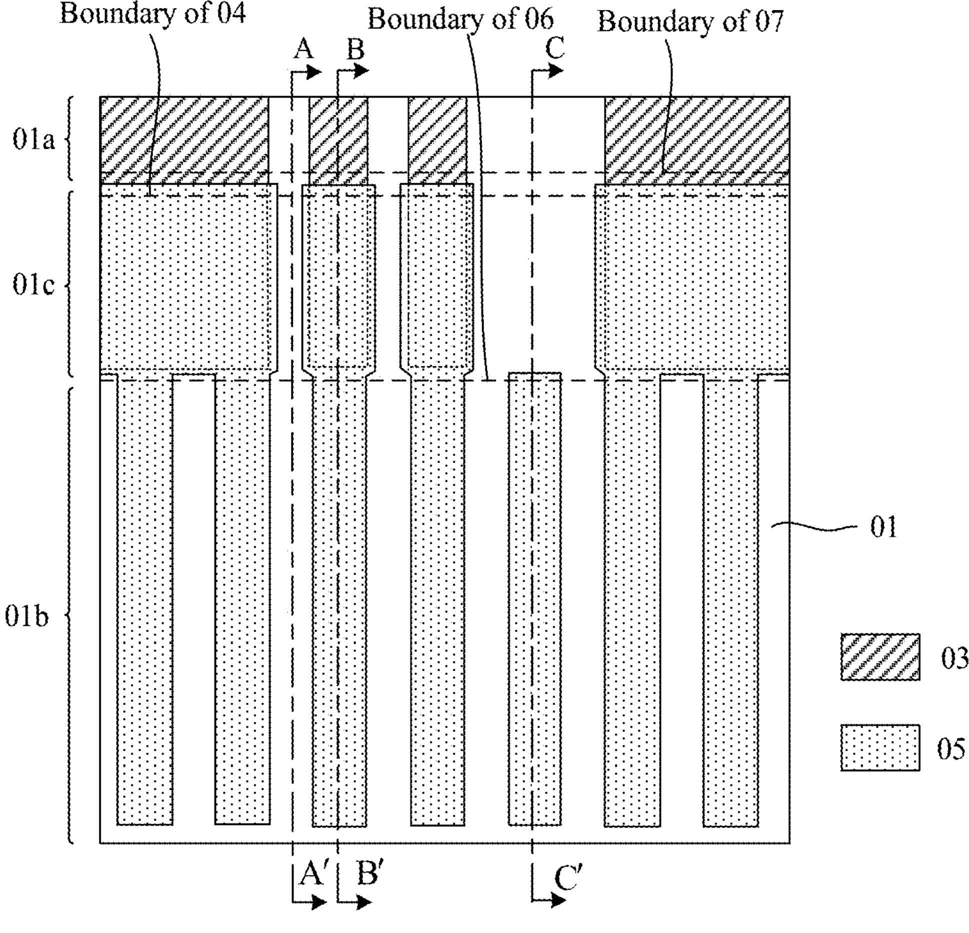
FIG. 1 is a top view of a wiring substrate in some practices.
Figure 2:
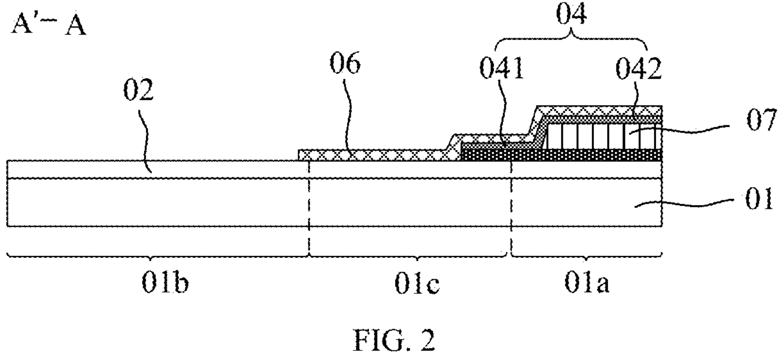
FIG. 2 is a section view of the wiring substrate shown in FIG. 1 at a position of AA'.
Figure 3:
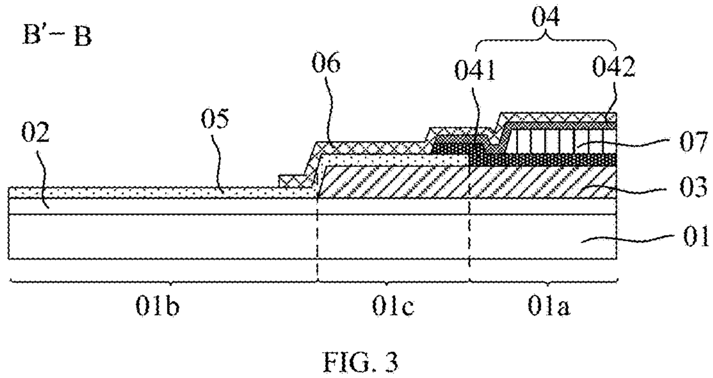
FIG. 3 is a section view of the wiring substrate shown in FIG. 1 at a position of BB'.
Figure 4:
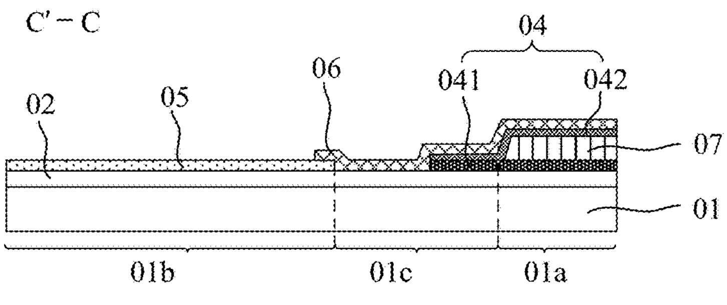
FIG. 4 is a section view of the wiring substrate shown in FIG. 1 at a position of CC'.

FIG. 1 is a top view of a wiring substrate in some practices. FIG. 2 is a section view of the wiring substrate shown in FIG. 1 at a position of AA'. FIG. 3 is a section view of the wiring substrate shown in FIG. 1 at a position of BB'. FIG. 4 is a section view of the wiring substrate shown in FIG. 1 at a position of CC'. In conjunction with FIG. 1 to FIG. 4, in some practices, the wiring substrate 00 includes a base 01, a buffer layer 02, a first conductive layer 03, a first insulative layer 04 (the first insulative layer 04 includes a first insulative sub-layer 041 and a second insulative sub-layer 042), a second conductive layer 05, a second insulative layer 06, and a planarization layer 07 between the first insulative sub-layer 041 and the second insulative sub-layer 042.

An exposed region surface, distal from the base 01, of the second conductive layer 05 requires an anti-oxidation treatment. For example, an electroless nickel/immersion gold process is performed on the expose surface of the second conductive layer 05 to form a nickel-gold layer on the surface, such that the oxidation resistance and/or connection reliability of the second conductive layer 05 are enhanced. Optionally, in the electroless nickel/immersion gold process, pickling is performed on a to-be-treated surface, and then the to-be-treated surface is placed in an activated solution containing $Pd^{2+}$ (palladium ion). In this case, a replacement reaction occurs between a metal (for example, Cu) in the exposed region surface in the second conductive layer 05 and $Pd^{2+}$ in the activated solution to generate $Cu^{2+}$ and Pd. Pd is attached to the surface, distal from the base 01, of the second conductive layer 05 to form a Pd layer. Then, the to-be-treated surface is placed in a solution mainly including nickel sulfate, sodium hypophosphate (a reducing agent that reduces nickel ions to nickel metal), and a complexing agent, such that a replacement reaction occurs between the Pd layer and the nickel ions in the solution to form a phosphorus-nickel alloy layer and $Pd^{2+}$. In this process, the Pd layer is converted to $Pd^{2+}$, and the $Pd^{2+}$ exists in the solution (that is, the Pd layer attached to the surface, distal from the base 01, of the second conductive layer 05 is removed). The phosphorus-nickel alloy layer is attached to the surface, distal from the base 01, of the second conductive layer 05. As the phosphorus-nickel alloy layer can be oxidized, a welding material (for example, tin) and the oxidized phosphorus-nickel alloy layer cannot be firmly and reliably connected. Thus, the wiring substrate 00 is immersed into a solution containing $Au^{2+}$ (gold ions), a gold immersion layer is formed on a surface of the phosphorus-nickel alloy layer, and gold particles in the gold immersion layer fill void in the phosphorus-nickel alloy layer to reduce a possibility of being oxidized of the phosphorus-nickel alloy layer and reduce the oxidization of the exposed region of the second conductive layer 05. As such, the surface of the exposed region of the second conductive layer 05 includes a nickel-gold layer (the nickel-gold layer includes the above Pd layer, the phosphorus-nickel alloy layer, and the gold immersion layer).

Figure 5:
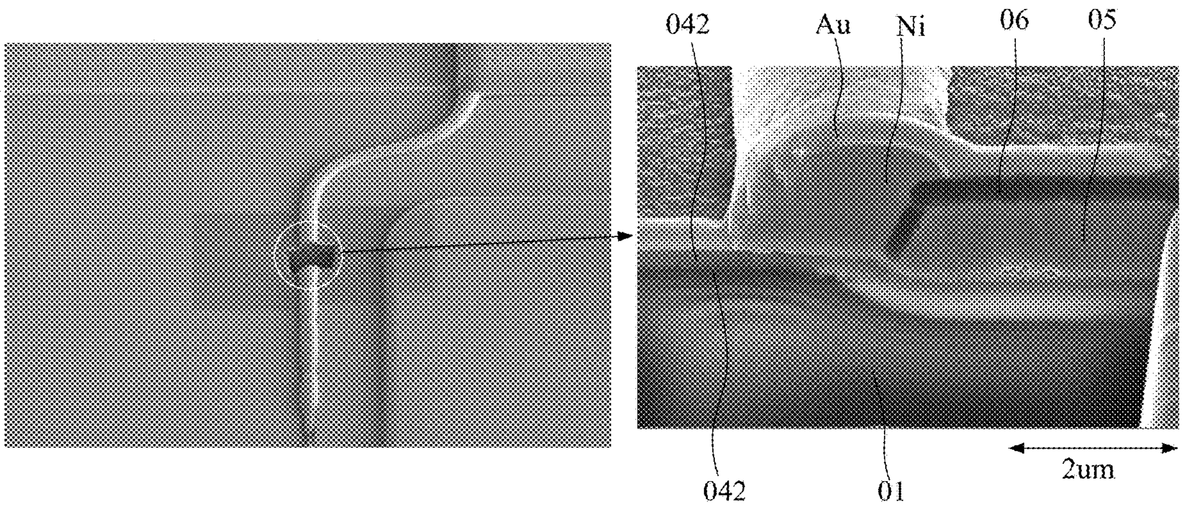
FIG. 5 is an electron microscope diagram of abnormal growth of a specific metal at an edge, in a connecting region, of a second conductive layer in a wiring substrate according to some embodiments of the present disclosure.
Figure 6:
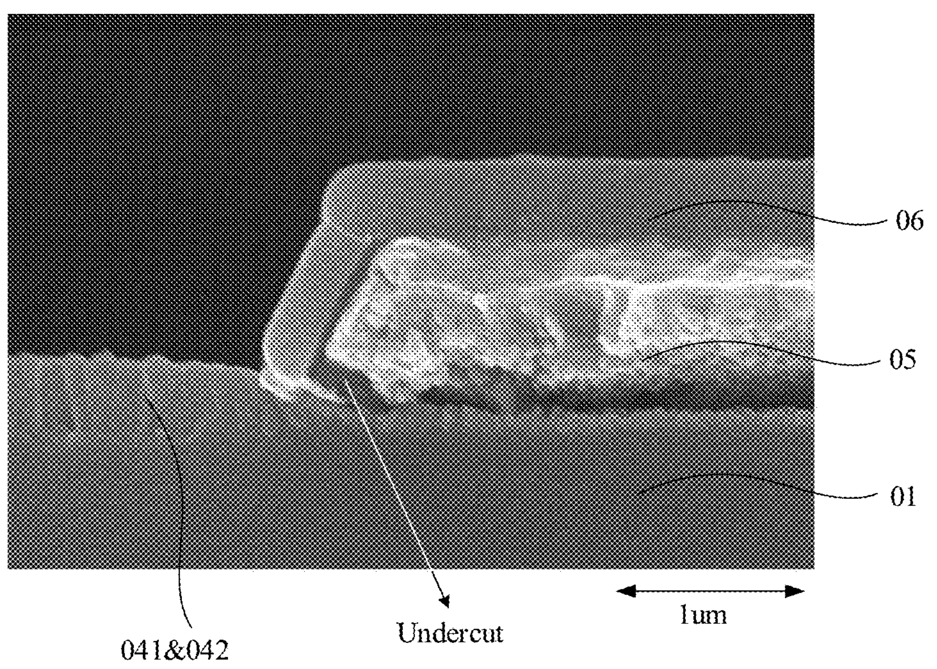
FIG. 6 is an electron microscope diagram of undercut of a second conductive layer in a wiring substrate according to some embodiments of the present disclosure.

In conjunction with FIG. 1 to FIG. 4, the first insulative sub-layer 041 and the second insulative sub-layer 042 are disposed in a functional region 01*a* of the base 01, the planarization layer 07 is only disposed in the functional region 01*a* and not disposed in a bonding region 01*b* and a connecting region 01*c*, and a boundary of the planarization layer 07 is disposed in the functional region 01*a*. In this case, a problem of abnormal growth of a specific metal exists at an edge, in the connecting region 01*c*, of the second conductive layer 05 in forming the nickel-gold layer. A portion, in the connecting region 01*c*, of the second conductive layer 05 is previously covered by the second insulative layer 06, and thus the above phenomenon should not occur. As shown in FIG. 5 and FIG. 6, the inventors have found that a boundary region of the second conductive layer 05 is a starting position of segment difference of the film layer, and undercut occurs in the second conductive layer 05, such that the second insulative layer 06 breaks at the position to cause the abnormal growth of Ni and Au in the electroless nickel/immersion gold process.

The reason for break of the second conductive layer 05 is as follows. In forming the first insulative sub-layer 041 and the second insulative sub-layer 042, a first insulative thin sub-film and a second insulative thin sub-film are first formed, and the first insulative sub-layer 041 and the second insulative sub-layer 042 are formed by etching the first insulative thin sub-film and the second insulative thin sub-film. As the acquired first insulative sub-layer 041 and second insulative sub-layer 042 are only disposed in the functional region 01*a*, portions, in the connecting region 01*c* and the bonding region 01*b*, of the first insulative thin sub-film and the second insulative thin sub-film are removed by dry etching with a specific gas. The first insulative thin sub-film and the second insulative thin sub-film require to be over-etched, for example, over-etched by 30%, to ensure no residual insulative thin film material upon etching. Furthermore, as the first insulative thin sub-film and the second insulative thin sub-film require to be over-etched, and a thickness of the buffer layer 02 on sides, proximal to the base 01, of the first insulative thin sub-film and the second insulative thin sub-film is less, the buffer layer 02 are entirely etched due to the over-etching. The direct contact of the buffer layer 02 and the base 01 may further cause that the base is partially etched, such that a flatness of the surface of the base 01 is poor (a roughness is increased). In the case that the second insulative sub-layer 042 is prepared, a second conductive thin film is then formed. Theoretically, the second conductive thin film is not in direct contact with the base 01. However, as the above over-etching process, partial region of the second conductive thin film is in direct contact with the base 01. In forming the second conductive layer 05 by etching the second conductive thin film, in the region, in direct contact with the base 01, of the second conductive thin film, the surface of the base 01 is rough, and an etching solution for etching the second conductive thin film flows to the surface, proximal to the base 01, of the second conductive thin film along the rough surface. A material in the portion, in contact with the base 01, of the second conductive thin film is etched, and the acquired second conductive layer 05 is in an undercut structure. Thus, the boundary region of the second conductive layer 05 is the starting position of segment difference of the film layer, undercut occurs in the second conductive layer 05, and the second insulative layer 06 for covering the second conductive layer 05 is prone to breaking at the undercut position, such that the abnormal growth of Ni and Au occurs at the boundary, in the connecting region 01*c*, of the second conductive layer 05 in the electroless nickel/immersion gold process, a yield of the wiring substrate 00 is poor, and the display effect of the display effect is poor.

Figure 7:
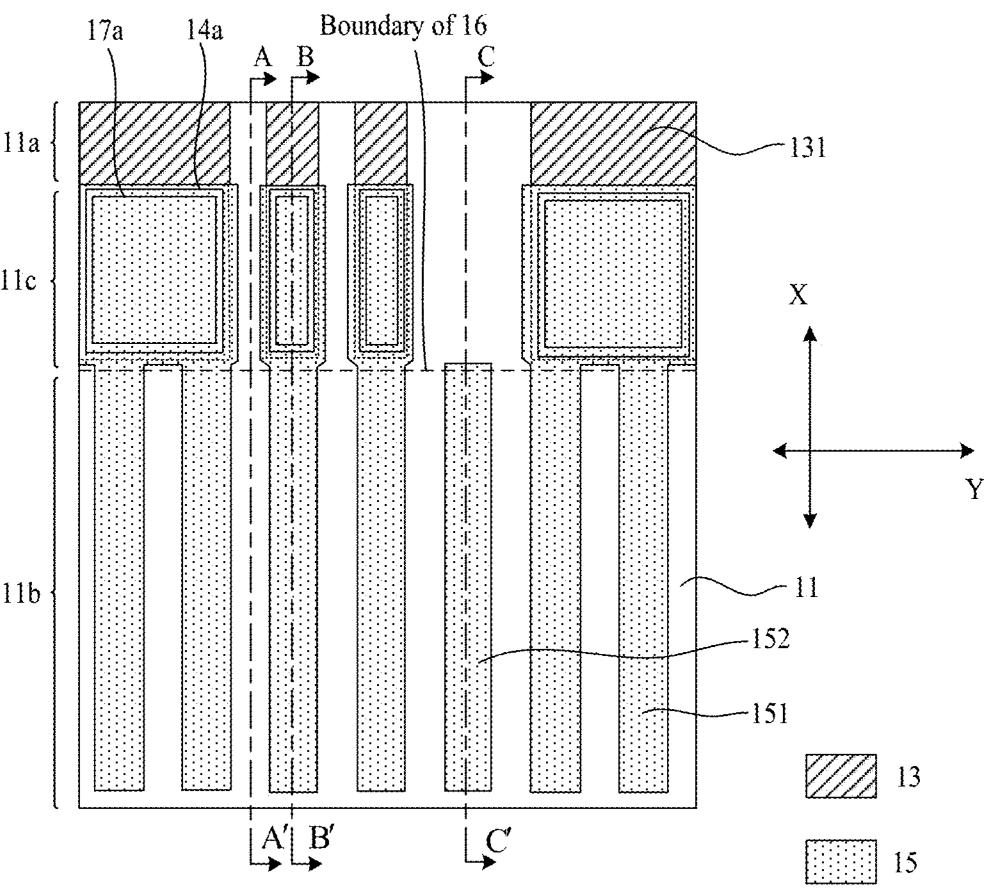
FIG. 7 is a top view of a wiring substrate according to some embodiments of the present disclosure.
Figure 8:
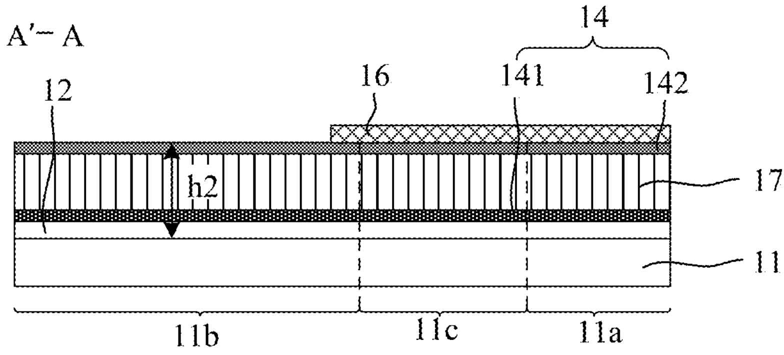
FIG. 8 is a section view of the wiring substrate shown in FIG. 7 at a position of AA'.
Figure 9:
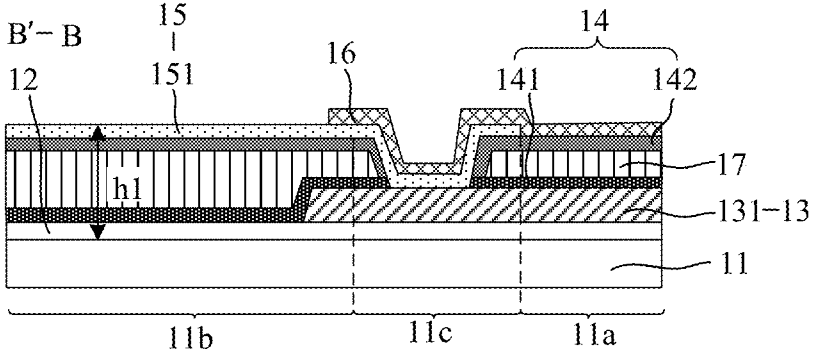
FIG. 9 is a section view of the wiring substrate shown in FIG. 7 at a position of BB'.
Figure 10:
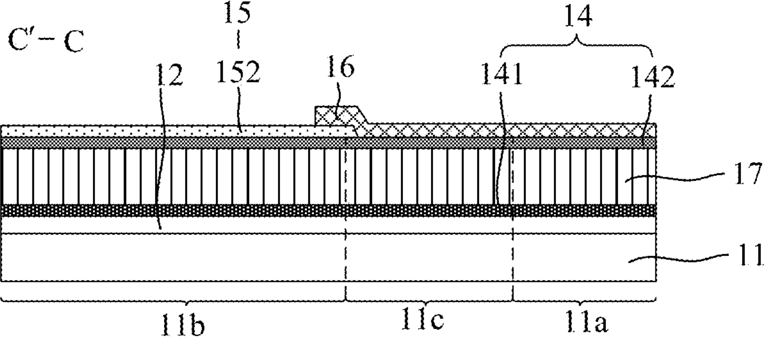
FIG. 10 is a section view of the wiring substrate shown in FIG. 7 at a position of CC'.

FIG. 7 is a top view of a wiring substrate according to some embodiments of the present disclosure. FIG. 8 is a section view of the wiring substrate shown in FIG. 7 at a position of AA'. FIG. 9 is a section view of the wiring substrate shown in FIG. 7 at a position of BB'. FIG. 10 is a section view of the wiring substrate shown in FIG. 7 at a position of CC'. In conjunction with FIG. 7 to FIG. 10, the wiring substrate 10 includes a base 11, a first conductive layer 13, a first insulative layer 14, a second conductive layer 15, and a second insulative layer 16.

The base 11 includes a functional region 11*a*, a bonding region 11*b*, and a connecting region 11*c* between the functional region 11*a* and the bonding region 11*b*. The first conductive layer 13 is disposed on a side of the base 11 and in the functional region 11*a* and the connecting region 11*c*. The first insulative layer 14 is disposed on a side, distal from the base 11, of the first conductive layer 13 and in the functional region 11*a*, the connecting region 11*c*, and the bonding region 11*b*. A first via 14*a* is defined in a portion, disposed in the connecting region 11*c*, of the first insulative layer 14 and is configured to expose the first conductive layer 13. The second conductive layer 15 is disposed on a side, distal from the base 11, of the first insulative layer 14 and in the connecting region 11*c* and the bonding region 11*b*, and electrically connected to the first conductive layer 13 via the first via 14*a*. The second insulative layer 16 is disposed on a side, distal from the base 11, of the second conductive layer 15 and in the connecting region 11*c* and the functional region 11*a*.

In the embodiments of the present disclosure, forming the first insulative layer 14 includes forming a first insulative thin film and forming the first insulative layer 14 by etching the first insulative thin film. As the first insulative layer 14 is disposed in the functional region 11*a*, the connecting region 11*c*, and the bonding region 11*b*, in etching the first insulative thin film, a portion, in the connecting region 11*c*, of the first insulative thin film is etched to form the first via 14*a*, and a portion, in the bonding region 11*b*, of the first insulative thin film is not required to be entirely etched. Thus, the base 11 is not etched even if the over-etching is performed, such that the flatness of the surface of the base 11 is ensured. Furthermore, the second conductive layer 15 is disposed on a flat surface on a side, distal from the base 11, of the first insulative layer 14, such that in forming the second conductive layer 15, the partial material of the film layer on a side, proximal to the base 11, of the second conductive layer 15 is avoided to be etched by the etching solution, and the undercut structure of the second conductive layer 15 is avoided, and the second insulative layer is not broken at a connecting position having a height difference of the second insulative layer and the second conductive layer 15. In forming the nickel-gold layer, the abnormal growth of the specific metal does not occur at the boundary, in the connecting region 11*c*, of the second conductive layer 15, the yield of the wiring substrate 10 is great, and the display effect of the display effect is great.

In summary, a wiring substrate is provided in the embodiments of the present disclosure. The first insulative layer in the wiring substrate is disposed in the functional region, the connecting region, and the bonding region. As such, in forming the first insulative layer by etching the first insulative thin film, the portion, in the connecting region, of the first insulative thin film is etched to form the first via, and the portion, in the bonding region, of the first insulative thin film does not require to be entirely etched. Furthermore, the second conductive layer is disposed on the flat surface on the side, distal from the base, of the first insulative layer, such that the undercut structure of the second conductive layer is avoided, the second insulative layer is avoided to be broken at the connecting position having a height difference of the second insulative layer and the second conductive layer, and the abnormal growth of the specific metal is avoided at the boundary, in the connecting region, of the second conductive layer. Thus, the yield of the wiring substrate is great, and the display effect of the display effect is great.

In addition, as a material of the first conductive layer 13 and a material of the first insulative layer 14 are different, in etching the first insulative thin film with the etching solution to form the first via 14*a* to acquire the first insulative layer 14, even if the over-etching is performed on the first insulative thin film, the etching solution does not etch the first conductive layer 13 on a side, proximal to the base 11, of the first insulative thin film, that is, the first conductive layer 13 is not affected, such that the reliable connection of the second conductive layer 15 and the first conductive layer 13 is ensured.

In conjunction with FIG. 7 to FIG. 10, the first insulative layer 14 includes a first insulative sub-layer 141 and a second insulative sub-layer 142 that are sequentially laminated along a direction away from the base 11. The first via 14*a* includes a first sub via in the first insulative sub-layer 141 and a second sub via in the second insulative sub-layer 142, and the second conductive layer 15 is electrically connected to the first conductive layer 13 via the first sub via and the second sub via.

An orthogonal projection of the first sub via on the base 11 is at least partially overlapped with an orthogonal projection of the second sub via on the base 11, such that the first conductive layer 13 is exposed by the two sub via. In some embodiments, an area of the orthogonal projection of the second sub via on the base 11 is greater than an area of the orthogonal projection of the first sub via on the base 11, and the orthogonal projection of the second sub via on the base 11 covers the orthogonal projection of the first sub via on the base 11.

In conjunction with FIG. 7 to FIG. 10, the wiring substrate 10 further includes a planarization layer 17 between the first insulative sub-layer 141 and the second insulative sub-layer 142. The planarization layer 17 is disposed in the functional region 11*a*, the connecting region 11*c*, and the bonding region 11*b*, and a second via 17*a* is defined in a portion, disposed in the connecting region 11*c*, of the planarization layer 17. The first sub via, the second via 17*a*, and the second sub via are configured to expose the first conductive layer 13, the second conductive layer 15 is disposed in the first sub via, the second via 17*a*, and the second sub via, and is electrically connected to the exposed first conductive layer 13. That is, the second conductive layer 15 is electrically connected to the first conductive layer 13 via the first sub via, the second via 17*a*, and the second sub via.

Figure 11:
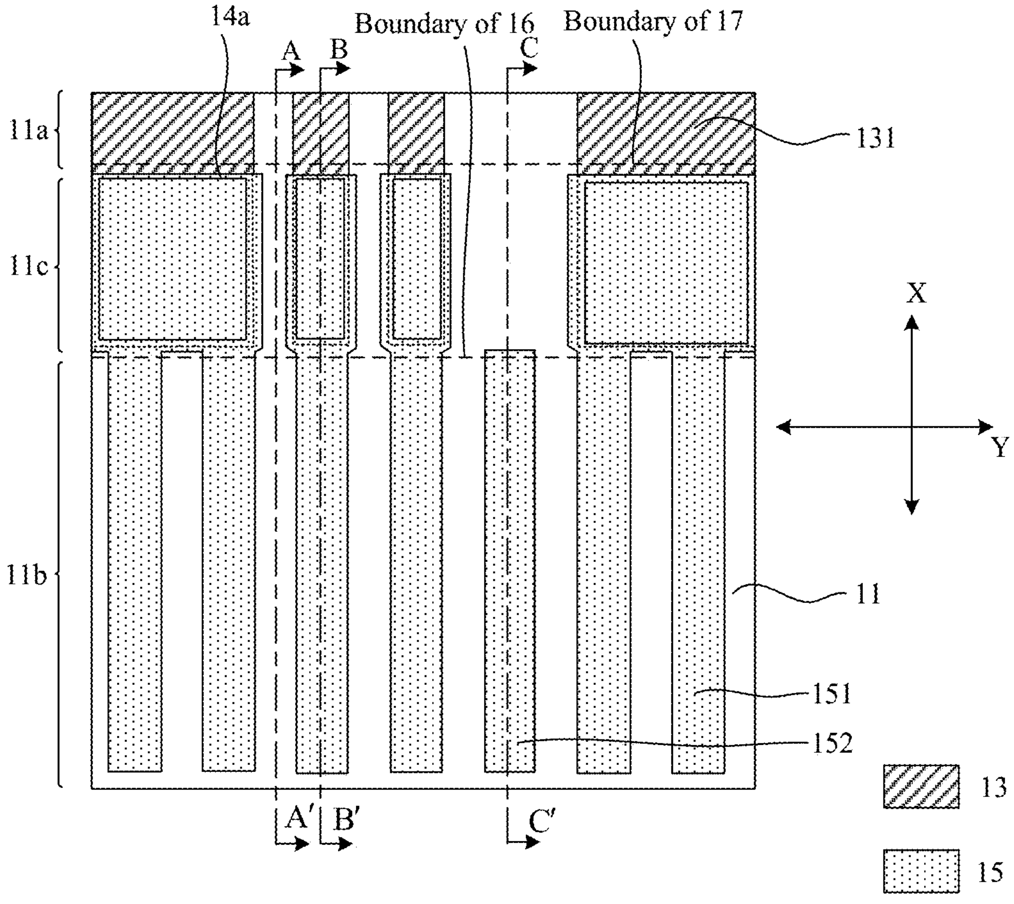
FIG. 11 is a top view of another wiring substrate according to some embodiments of the present disclosure.
Figure 12:
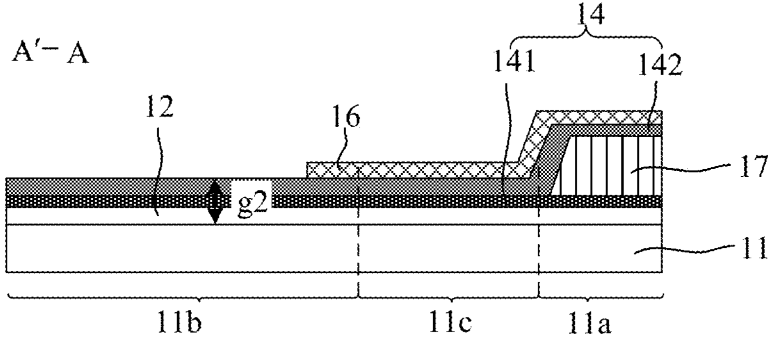
FIG. 12 is a section view of the wiring substrate shown in FIG. 11 at a position of AA'.
Figure 13:
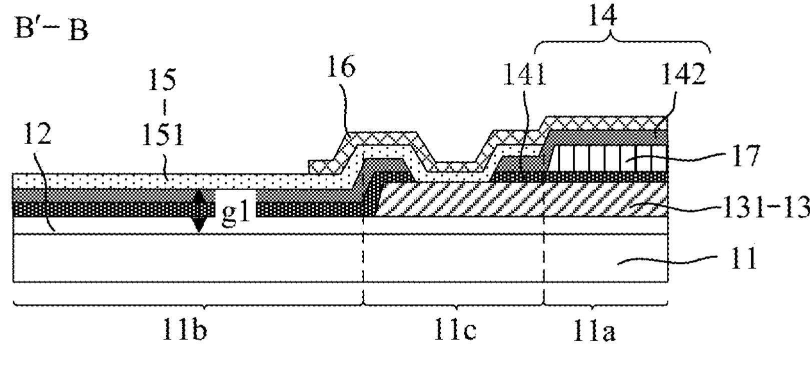
FIG. 13 is a section view of the wiring substrate shown in FIG. 11 at a position of BB'.
Figure 14:
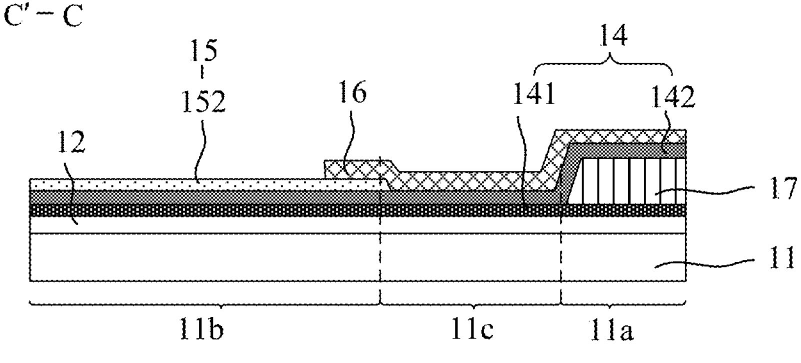
FIG. 14 is a section view of the wiring substrate shown in FIG. 11 at a position of CC'.

FIG. 11 is a top view of another wiring substrate according to some embodiments of the present disclosure. FIG. 12 is a section view of the wiring substrate shown in FIG. 11 at a position of AA'. FIG. 13 is a section view of the wiring substrate shown in FIG. 11 at a position of BB'. FIG. 14 is a section view of the wiring substrate shown in FIG. 11 at a position of CC'. In conjunction with FIG. 11 to FIG. 14, the wiring substrate 10 further includes a planarization layer 17 between the first insulative sub-layer 141 and the second insulative sub-layer 142. The planarization layer 17 is disposed in the functional region 11*a*, and is not disposed in the connecting region 11*c* and the bonding region 11*b*.

In the technical solutions shown in FIG. 11 to FIG. 14, as the planarization layer 17 is not disposed in the connecting region 11*c*, only the first insulative sub-layer 141 and the second insulative sub-layer 142 are disposed between a portion of the second conductive layer 15 in the connecting region 11*c* and a portion of the first conductive layer 14 in the connecting region 11*c*. As such, the second conductive layer 15 is electrically connected to the first conductive layer 13 via the first sub via and the second sub via.

In some embodiments, the planarization layer 17 is disposed in the connecting region 11*c* in the technical solutions shown in FIG. 7 to FIG. 10, and the planarization layer 17 is not disposed in the connecting region 11*c* in the technical solutions shown in FIG. 11 to FIG. 14. As such, in the technical solutions shown in FIG. 7 to FIG. 10, a thickness of the film layers (the first insulative sub-layer 141, the planarization layer 17, and the second insulative sub-layer 142) between the first conductive layer 13 and the second conductive layer 15 is great, and a distance between the first conductive layer 13 and the second conductive layer 15 along a direction perpendicular to a bearing face of the base 11 is great. In the technical solutions shown in FIG. 11 to FIG. 14, a thickness of the film layers (the first insulative sub-layer 141 and the second insulative sub-layer 142) between the first conductive layer 13 and the second conductive layer 15 is less, and a distance between the first conductive layer 13 and the second conductive layer 15 along a direction perpendicular to a bearing face of the base 11 is less.

Generally, an area of the first conductive layer 13 exposed by the via in the film layers between the first conductive layer 13 and the second conductive layer 15 is negatively correlated with the thickness of the film layers between the first conductive layer 13 and the second conductive layer 15. That is, the greater the thickness of the film layers between the first conductive layer 13 and the second conductive layer 15, the less the area of the first conductive layer 13 exposed by the via in the film layers between the first conductive layer 13 and the second conductive layer 15. The less the thickness of the film layers between the first conductive layer 13 and the second conductive layer 15, the greater the area of the first conductive layer 13 exposed by the via in the film layers between the first conductive layer 13 and the second conductive layer 15.

That is, the area of the first conductive layer 13 exposed by the via (the first sub via, the second via 17*a*, and the second sub via) in the first insulative sub-layer 141, the planarization layer 17, and the second insulative sub-layer 142 in the technical solutions shown in FIG. 7 to FIG. 10 is less than the area of the first conductive layer 13 exposed by the via (the first sub via and the second sub via) in the first insulative sub-layer 141 and the second insulative sub-layer 142 in the technical solutions shown in FIG. 11 to FIG. 14. As such, compared with the technical solutions shown in FIG. 7 to FIG. 10, a contact area between the second conductive layer 15 and the first conductive layer 13 is great in the technical solutions shown in FIG. 11 to FIG. 14, such that the connection reliability between the second conductive layer 15 and the first conductive layer 13 is improved.

In addition, as the planarization layer 17 is not disposed in the connecting region 11*c* in the technical solutions shown in FIG. 11 to FIG. 14, in the subsequent process of bonding the circuit board and the second conductive layer 15, an effect of the bonding pressure on the planarization layer 17 is avoided, and the reliability of the wiring substrate 10 is ensured.

Referring to FIG. 7 to FIG. 14, the first conductive layer 13 includes a plurality of functional electrodes 131, and the second conductive layer 15 includes a plurality of bonding electrodes 151 extending along a first direction X and arranged along a second direction Y. The first direction X is an arrangement direction of the functional region 11*a*, the connecting region 11*c*, the bonding region 11*b*, and the second direction Y is intersected with the first direction X. For example, the second direction Y is perpendicular to the first direction X.

An end, proximal to the functional region 11*a* in the first direction X, of each of the plurality of bonding electrodes 151 is electrically connected to an end, proximal to the bonding region 11*b* in the first direction X, of each of the plurality of functional electrodes 131 via the via in the film layers between the first conductive layer 13 and the second conductive layer 15. For example, in the technical solutions shown in FIG. 7 to FIG. 10, the end, proximal to the functional region 11*a* in the first direction X, of each of the plurality of bonding electrodes 151 is electrically connected to the end, proximal to the bonding region 11*b* in the first direction X, of each of the plurality of functional electrodes 131 via the first via 14*a* (the first sub via and the second sub via) and the second via 17*a*. In the technical solutions shown in FIG. 11 to FIG. 14, the end, proximal to the functional region 11*a* in the first direction X, of each of the plurality of bonding electrodes 151 is electrically connected to the end, proximal to the bonding region 11*b* in the first direction X, of each of the plurality of functional electrodes 131 via the first via 14*a* (the first sub via and the second sub via).

In some embodiments, the end, proximal to the bonding region 11*b* in the first direction X, of each functional electrode 131 is electrically connected to ends, proximal to the functional region 11*a* in the first direction X, of a plurality of bonding electrodes 151. That is, the circuit board transmits signals to a functional part (for example, a light-emitting unit) in the functional region 11*a* through one bonding electrode 151 and one functional electrode 131 connected to the bonding electrode 151. Alternatively, the circuit board transmits signals to the functional part in the functional region 11*a* through a plurality of bonding electrodes 151 and one functional electrode 131 connected to the plurality of bonding electrodes 151.

Illustratively, in FIG. 7 and FIG. 11, in a direction from left to right, the first bonding electrode and the second bonding electrode are connected to the same functional electrode, and the fifth bonding electrode and the sixth bonding electrode are connected to the same functional electrode. The third bonding electrode is connected to one functional electrode, and the fourth bonding electrode is connected to one functional electrode.

In the embodiments of the present disclosure, the functional region 11*a* is a region in the base 11 for disposing the functional electrode 131 and the functional part (for example, the light-emitting unit) connected to the functional electrode. The bonding region 11*b* is a region in the base 11 for disposing the bonding region 151, and the bonding region 151 is configured to be coupled to the circuit board. The connecting region 11*c* is a region for connecting the first conductive layer 13 and the second conductive layer 15 via the via.

Referring to FIG. 7 to FIG. 14, the second conductive layer 15 further includes at least one dummy bonding electrode 152 extending along the first direction X. The at least one dummy bonding electrode 152 and the plurality of bonding electrodes 151 are arranged along the second direction Y, and each of the at least one dummy bonding electrode 152 is not electrically connected to the plurality of functional electrodes 131. By disposing the dummy bonding electrode 152, the uniformity of the portion, in the bonding region 11*b*, of the second conductive layer 15 is great.

In the embodiments of the present disclosure, in the wiring substrate 10 shown in FIG. 7 to FIG. 10, the planarization layer 17 is disposed in all region of the bonding region 11*b*, and thus in the bonding region 11*b*, a segment difference of the planarization layer 17 in the direction perpendicular to the bearing face of the base 11 between the region disposed with the bonding electrode 151 and the dummy bonding electrode 152 of the second conductive layer 15 and the region (for example, a region between adjacent electrodes) not disposed with the bonding electrode 151 and the dummy bonding electrode 152 of the second conductive layer 15 is less, such that the subsequent bonding effect of the circuit board and the bonding electrode 151 is ensured.

In the wiring substrate 10 shown in FIG. 11 to FIG. 14, the planarization layer 17 is not disposed in all region of the bonding region 11*b*, and thus in the bonding region 11*b*, a segment difference of the planarization layer 17 in the direction perpendicular to the bearing face of the base 11 between the region disposed with the bonding electrode 151 and the dummy bonding electrode 152 of the second conductive layer 15 and the region (for example, a region between adjacent electrodes) not disposed with the bonding electrode 151 and the dummy bonding electrode 152 of the second conductive layer 15 is less, such that the subsequent bonding effect of the circuit board and the bonding electrode 151 is ensured. In addition, as the planarization layer 17 is not disposed in the bonding region 11*b*, an effect of the bonding pressure on the planarization layer 17 is avoided in the subsequent process of bonding the circuit board and the bonding electrode 151 in the bonding region 11*b*, such that the reliability of the wiring substrate 10 is ensured.

In the above two solutions, the first insulative layer 14 includes a target face facing away from the base 11. A distance between a portion, in the bonding electrode 151 in the bonding region 11*b*, of the target face and the base 11 is equal to a distance between a portion, other than the portion in the bonding electrode 151 in the bonding region 11*b*, of the target face and the base 11.

In some embodiments, the distance h1 between the portion, in the bonding electrode 151 in the bonding region 11*b*, of the target face and the base 11 in FIG. 9 is equal to the distance h2 between the portion, other than the portion in the bonding electrode 151 in the bonding region 11*b*, of the target face and the base 11 in FIG. 8. That is, h1 is equal to h2. The distance g1 between the portion, in the bonding electrode 151 in the bonding region 11*b*, of the target face and the base 11 in FIG. 13 is equal to the distance g2 between the portion, other than the portion in the bonding electrode 151 in the bonding region 11*b*, of the target face and the base 11 in FIG. 12. That is, g1 is equal to g2.

In conjunction with FIG. 7 to FIG. 14, the wiring substrate 10 further includes a buffer layer 12. The buffer layer 12 is disposed between the base 11 and the first conductive layer 13. The buffer layer 12 functions as planarization, and thus improves the adhesion between the first conductive layer 13 and the base 11.

In some embodiments, a thickness of the base 11 is 0.7 mm±0.05 mm, that is, from 0.65 mm to 0.75 mm. A thickness of the buffer layer 12 is 1500 A (angstrom)±150 A, that is, from 1350 A to 1650 A. A thickness of the first conductive layer 13 is 1.8 μm±0.18 μm, that is, from 1.62 μm to 1.98 μm. A thickness of the first insulative sub-layer 141 is 2400 A±240 A, that is, from 2160 A to 2640 A. A thickness of the second insulative sub-layer 142 is 1200 A±120 A, that is, from 1080 A to 1320 A. A thickness of the second conductive layer 15 ranges from 0.6 μm to 1.2 μm. A thickness of the second insulative layer 16 is 2400 A±240 A, that is, from 2160 A to 2640 A. A thickness of the planarization layer 17 is 7.5 μm±0.75 μm, that is, from 6.75 μm to 8.25 μm.

In the embodiments of the present disclosure, the first conductive layer 13 includes a drive voltage signal line VLED, a common voltage signal line 101 (not shown in FIG. 15), and other signal lines. The signal lines may be the functional electrode 131 in the first conductive layer 13.

The drive voltage signal line VLED and/or the common voltage signal line 101 extend roughly along the first direction X, one end(s) of the drive voltage signal line VLED and/or the common voltage signal line 101 extend(s) to any position, distal from the bonding region 11*b*, of the functional region 11*a* of the wiring substrate 10, and the other end(s) of the drive voltage signal line VLED and/or the common voltage signal line 101 is (are) connected to a plurality of bonding electrodes 151 extending from the bonding region 11*b* to the functional region 11*a*. The first conductive layer 13 shown in FIG. 7 and FIG. 11 represents one drive voltage signal line VLED or one common voltage signal line 101, and is in direct contact with the second conductive layer 15 in the connecting region 11*c*. As a line width of the drive voltage signal line VLED or one common voltage signal line 101 is greatly greater than a line width of the bonding electrode 151, the other end of the drive voltage signal line VLED or one common voltage signal line 101 corresponds to and is electrically connected to a plurality of bonding electrode 151.

Figure 15:
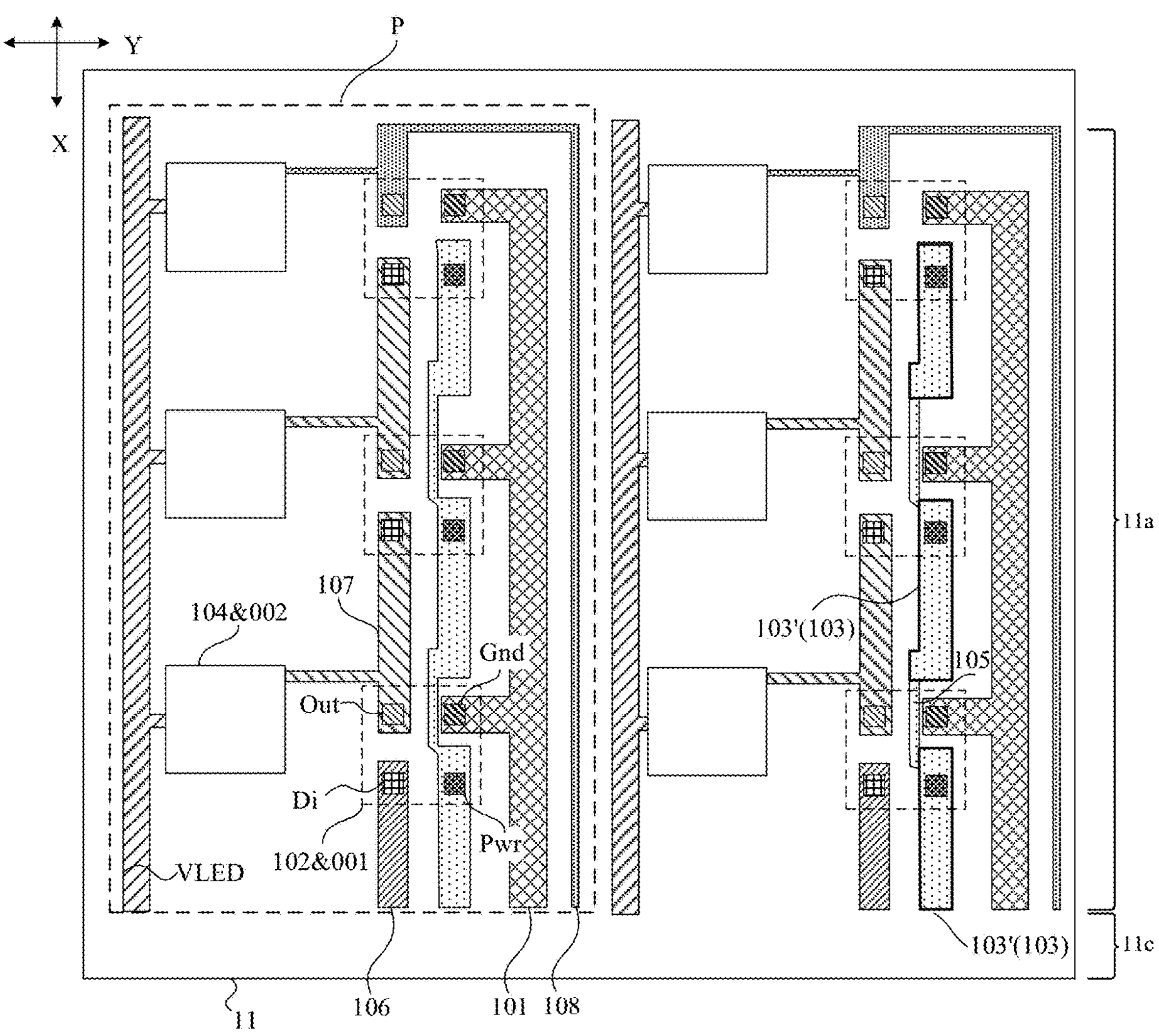
FIG. 15 is a schematic planar diagram of a wiring substrate in a functional region according to some embodiments of the present disclosure.

FIG. 7 to FIG. 14 mainly show an arrangement of the bonding region 11*b* and the connecting region 11*c* in the wiring substrate 10, and FIG. 15 shows an arrangement of the functional region 11*a* in the wiring substrate 10 for illustration for clear understanding of the whole arrangement of the wiring substrate 10.

The functional region 11*a* of the wiring substrate 10 is provided with a pad group to be bonded to tens of thousands of electronic parts. Referring to FIG. 15, in the functional region 11*a*, the wiring substrate 10 includes: a first pad group 102, a power signal line 103, and a second pad group 104.

The first pad group 102 is disposed on the base 11, and includes a power pad Pwr and an output pad Out. In some embodiments, the first pad group 102 is coupled to a micro driving chip 001. The power signal line 103 and the first pad group 102 are disposed on a same side of the base 11, and the power signal line 103 is coupled to the power pad Pwr. The second pad group 104 and the first pad group 102 are disposed on a same side of the base 11. In some embodiments, each second pad group 104 is coupled to an electronic part 002. The region, in the functional region 11*a* and with exposed surface, of the second conductive layer 103 forms the above first pad group 102 and the second pad group 104. In some embodiments, the second insulative layer 16 is not disposed in the bonding region, and thus the partial region, in the bonding region 11*b*, of the second conductive layer 15 is exposed. The exposed region of the second conductive layer 15 is used as a pad. The first pad group 102 is coupled to the micro driving chip 001 by refluxing soldering process with the aid of solder, and the second pad group 104 is coupled to the electronic part 002 by refluxing soldering process with the aid of solder. The second conductive layer 15 is disposed in the bonding region 11*b*, and the expose portion functions as a bonding portion (for example, the bonding portion is a portion other than a portion connected to the functional electrode 131) of the bonding electrode 151. The bonding portion of the bonding electrode 151 is bonded and connected to a connecting finger structure of the circuit board (for example, FPC) by a heat pressing process with the aid of an anisotropic conductive film. In some embodiments, the base 11 includes a plurality of pad regions P, and each pad region P includes a plurality of cascaded first pad groups 102 and a plurality of second pad groups 104 coupled to the plurality of first pad groups 102. In some embodiments, in one pad region P, the plurality of cascaded first pad groups 102 are arranged in an array along the first direction X and/or the second direction Y, which is not limited herein. FIG. 15 is illustrated by taking the plurality of cascaded first pad groups 102 being arranged in one column in one pad region P as an example. In some embodiments, one power signal line 103 is coupled to a power pad Pwr of the plurality of first pad groups 102 that are arranged along the first direction X and cascaded in one pad region P, such that the winding of the power signal line 103 is reduced, the resistance of the power signal line 103 is reduced, and a pulse width modulation signal loss on power signal line 103 is further reduced. In some embodiments, the wiring substrate 10 further includes a connecting line 105, and one power signal line 103 includes a plurality sub-lines 103'. Two sub-lines 103' adjacent along the first direction X are connected via one connecting line 105, such that the same power signal line 103 supplies power to the power pad Pwr of the plurality of first pad groups 102 that are arranged along the first direction X and cascaded in one pad region P. In some embodiments, the connecting line 105 and the sub-line 103' are of an integrated structure. In some embodiments, the first pad group 102 further includes an address pad Di and a ground pad Gnd. The address pad Di and the power pad Pwr in the same first pad group 102 are spaced apart along the second direction Y, and the address pad Di and the output pad Out are spaced apart along the first direction X. The ground pad Gnd and the power pad Pwr are spaced apart along the first direction X, and the ground pad Gnd and the output pad Out are spaced apart along the second direction Y. Illustratively, the output pad Out is disposed at an upper left corner of the first pad group 102, the address pad Di is disposed at a lower left corner of the first pad group 102, the ground pad Gnd is disposed at an upper right corner of the first pad group 102, and the power pad Pwr is disposed at a lower right corner of the first pad group 102. Each first pad group 102 is coupled to one micro driving chip 001, and each second pad group is coupled to a plurality of electronic parts 002. In some embodiments, the address pad Di receives an address signal to select the micro driving chip 001 of corresponding address. The power pad Pwr supplies a first operation voltage and communication data to the micro driving chip 001, and the communication data is configured to control the luminance of the corresponding light-emitting elements. The output pad Out outputs a relay signal and a drive signal in different periods. The relay signal is an address signal supplied to the address pad Di in the first pad group 102 of the next level, and the drive signal is a drive current for driving the light-emitting element coupled to the first pad group 102 of the output pad Out to emit light. The ground pad Gnd receives a common voltage signal. In some embodiments, in each first pad group 102, the power pad Pwr, the output pad Out, the ground pad Gnd, and the address pad Di are arranged in the same way, such that a simple wire path is present between the cascaded first pad groups 102 in the same pad area P, and more windings are avoided.

In some embodiments, the wiring substrate 10 further includes an address signal line 106, and an address signal line 106 is coupled to the address pad Di of the first pad group 102 of the first level in a pad region P, such that the address signal supplied by the address signal line 107 is received by the address pad Di of the first pad group 102 of the first level in each pad region P. In some embodiments, the wiring substrate 10 further includes a cascaded line 107 configured to connect the output pad Out of the first pad group 102 of $n^{th}$ level and the address pad Di of the first pad group 102 of $(n+1)^{th}$ level in the same pad region P, n being a positive integer, such that the relay signal from the output pad Out of the first pad group 102 of the $n^{th}$ level is supplied to the address pad Di of the first pad group 102 of the $(n+1)^{th}$ level by the cascaded line 107. In some embodiments, the wiring substrate 10 further includes a feedback signal line 108, and the feedback signal line 108 is coupled to the output pad Out of the first pad group 102 of the last level in the pad region P to form a loop for transmitting the address signal in the pad region P. In some embodiments, the wiring substrate 10 further includes a common voltage signal line 101, and the common voltage signal line 101 is coupled to the ground pads of all first pad groups 102 in the pad region P. In some embodiments, the wiring substrate 10 further includes a drive voltage signal line VLED for coupling to the electronic part 002.

By taking FIG. 15 as an example, in the functional region 11*a* of the wiring substrate, the first conductive layer 13 is configured to achieve the above power signal line 103, the connecting line 105, the address signal line 106, the cascaded line 107, the feedback signal line 108, the common voltage signal line 101, drive voltage signal line VLED, and a connecting line (not shown in the drawing) connecting the first pad group and the second pad group and connecting the second pad groups. In preparing process, the signal lines are formed by patterning the first conductive layer 13 by a one patterning process using a same mask plate.

It should be understood that in some embodiments, in the functional region 11*a* of the wiring substrate, the second conductive layer 15 is only configured to achieve the power signal line 103, the address signal line 106, the feedback signal line 108, the common voltage signal line 101, and the drive voltage signal line VLED, and the second conductive layer 15 is configured to achieve a connecting line for connecting the connecting line 105 and the cascaded line 107, connecting the first pad group and the second pad group, and connecting the second pad groups.

In summary, a wiring substrate is provided in the embodiments of the present disclosure. The first insulative layer in the wiring substrate is disposed in the functional region, the connecting region, and the bonding region. As such, in forming the first insulative layer by etching the first insulative thin film, the portion, in the connecting region, of the first insulative thin film is etched to form the first via, and the portion, in the bonding region, of the first insulative thin film does not require to be entirely etched. Furthermore, the second conductive layer is disposed on the flat surface on the side, distal from the base, of the first insulative layer, such that the undercut structure of the second conductive layer is avoided, the second insulative layer is avoided to be broken at the connecting position having a height difference of the second insulative layer and the second conductive layer, and the abnormal growth of the specific metal is avoided at the boundary, in the connecting region, of the second conductive layer. Thus, the yield of the wiring substrate is great, and the display effect of the display effect is great.

Figure 16:
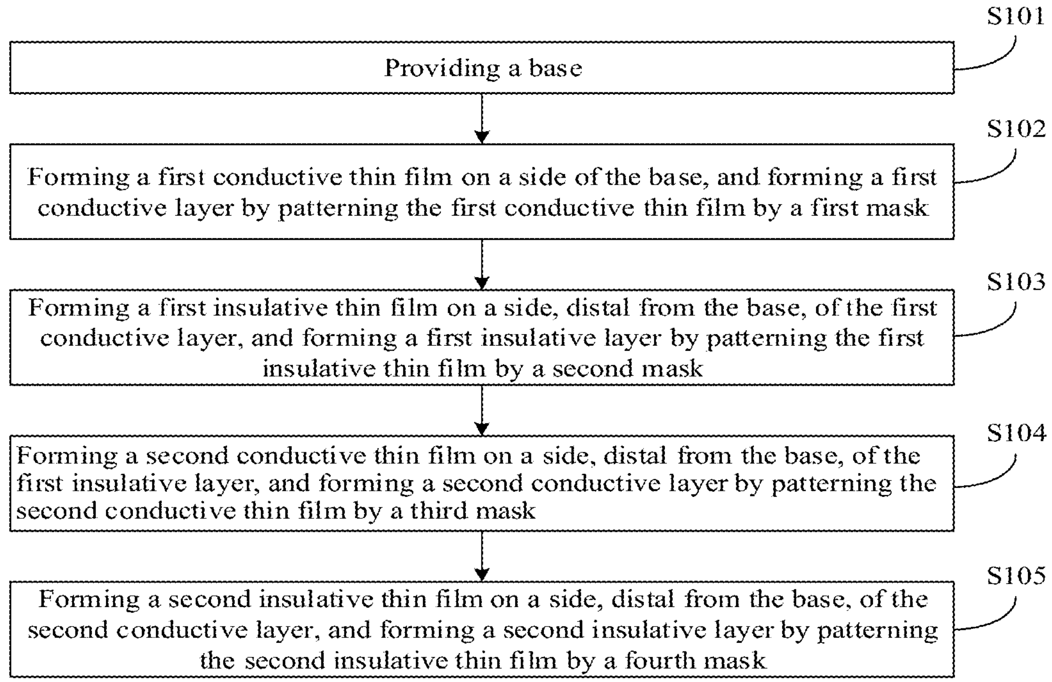
FIG. 16 is a flow chart of a method for preparing a wiring substrate according to some embodiments of the present disclosure.

FIG. 16 is a flow chart of a method for preparing a wiring substrate according to some embodiments of the present disclosure. The method is applicable to preparing the wiring substrate 10 in the above embodiments. Referring to FIG. 16, the method includes the following processes.

In S101, a base is provided.

In the embodiments of the present disclosure, the base 11 includes a functional region 11*a*, a bonding region 11*b*, and a connecting region 11*c* between the functional region 11*a* and the bonding region 11*b*. The base is a flexible or a rigid material. In some embodiments, the material of the base is polyethylene naphthalene diformate (PEN resin), silicone resin, polyimide, glass, quartz, plastic, and the like, which is not limited in the embodiments of the present disclosure.

In S102, a first conductive thin film is formed on a side of the base, and a first conductive layer is formed by patterning the first conductive thin film by a first mask.

The first conductive thin film is formed on the side of the base by magnetron sputtering or electroplating, and the first conductive layer is formed by patterning the first conductive thin film by the first mask. The first conductive layer is disposed in the functional region and the connecting region, and the first conductive layer includes the above functional electrode.

In some embodiments, the first conductive layer is the above drive voltage signal line, the address signal line, the power signal line, the data drive signal line, the common voltage signal line, and the feedback signal line. The first conductive layer includes a first conductive sub-layer, a second conductive sub-layer, and a third conductive sub-layer that are sequentially laminated along a direction away from the base. Materials of the first conductive sub-layer and the third conductive sub-layer are the molybdenum niobium alloy (MoNb), and a material of the second conductive sub-layer is Cu. That is, the first conductive layer is a three-laminated-layer structure of MoNb/Cu/MoNb. In some embodiments, the first conductive layer is a three-laminated-layer structure of Mo/Cu/Mo.

In S103, a first insulative thin film is formed on a side, distal from the base, of the first conductive layer, and a first insulative layer is formed by patterning the first insulative thin film by a second mask.

The first insulative thin film is formed on the side, distal from the base, of the first conductive layer by magnetron sputtering, and the first insulative layer is formed by patterning the first insulative thin film by the second mask. The first insulative layer is disposed in the functional region, the connecting region, and the bonding region. A first via is defined in a portion, disposed in the connecting region, of the first insulative layer and is configured to expose the first conductive layer.

In some embodiments, a material of the first insulative layer is an inorganic material, for example, at least one of silicon nitride, silicon oxide, or at least one of silicon nitride.

In S104, a second conductive thin film is formed on a side, distal from the base, of the first insulative layer, and a second conductive layer is formed by patterning the second conductive thin film by a third mask.

In the embodiments of the present disclosure, the second conductive thin film is formed on the side, distal from the base, of the first insulative layer by magnetron sputtering or electroplating, and the second conductive layer is formed by patterning the second conductive thin film by the third mask. The second conductive layer is disposed in the connecting region and the bonding region, and is electrically connected to the first conductive layer via the first via 14*a*.

In some embodiments, the second conductive layer includes the above first pad group, the second pad group, the bonding electrode, and the dummy bonding electrode. The first pad group is configured to dispose the micro driving chip, and the second pad group is configured to dispose the electronic part. The second conductive layer includes a fourth conductive sub-layer, a fifth conductive sub-layer, and a sixth conductive sub-layer that are sequentially laminated along the direction away from the base. Materials of the fourth conductive sub-layer and the sixth conductive sub-layer are MoNb, and a material of the fifth conductive sub-layer is Cu. That is, the second conductive layer is a three-laminated-layer structure of MoNb/Cu/MoNb. In some embodiments, the second conductive layer is a three-laminated-layer structure of Mo/Cu/Mo.

In S105, a second insulative thin film is formed on a side, distal from the base, of the second conductive layer, and a second insulative layer is formed by patterning the second insulative thin film by a fourth mask.

The second insulative thin film is formed on the side, distal from the base, of the second conductive layer by magnetron sputtering, and the second insulative layer is formed by patterning the second insulative thin film by the fourth mask. The second insulative layer is disposed in the connecting region and the bonding region.

In some embodiments, a material of the second insulative layer is an inorganic material, for example, at least one of silicon nitride, silicon oxide, or at least one of silicon nitride.

In the embodiments of the present disclosure, as the first insulative layer is disposed in the functional region, the connecting region, and the bonding region, in etching the first insulative thin film, a portion, in the connecting region, of the first insulative thin film is etched to form the first via, and a portion, in the bonding region, of the first insulative thin film is not required to be entirely etched. Thus, the base is not etched even if the over-etching is performed, such that the flatness of the surface of the base is ensured. Furthermore, the second conductive layer is disposed on a flat surface on a side, distal from the base, of the first insulative layer, such that in forming the second conductive layer, the partial material of the film layer on a side, proximal to the base, of the second conductive layer is avoided to be etched by the etching solution, and the undercut structure of the second conductive layer is avoided, and the second insulative layer is not broken at the connecting position having a height difference of the second insulative layer and the second conductive layer. In forming the nickel-gold layer, the abnormal growth of the specific metal does not occur at the boundary, in the connecting region, of the second conductive layer, the yield of the wiring substrate is great, and the display effect of the display effect is great.

In summary, a method for preparing a wiring substrate is provided in the embodiments of the present disclosure. The first insulative layer in the wiring substrate is disposed in the functional region, the connecting region, and the bonding region. As such, in forming the first insulative layer by etching the first insulative thin film, the portion, in the connecting region, of the first insulative thin film is etched to form the first via, and the portion, in the bonding region, of the first insulative thin film does not require to be entirely etched. Furthermore, the second conductive layer is disposed on the flat surface on the side, distal from the base, of the first insulative layer, such that the undercut structure of the second conductive layer is avoided, the second insulative layer is avoided to be broken at the connecting position having a height difference of the second insulative layer and the second conductive layer, and the abnormal growth of the specific metal is avoided at the boundary, in the connecting region, of the second conductive layer. Thus, the yield of the wiring substrate is great, and the display effect of the display effect is great.

Figure 17:
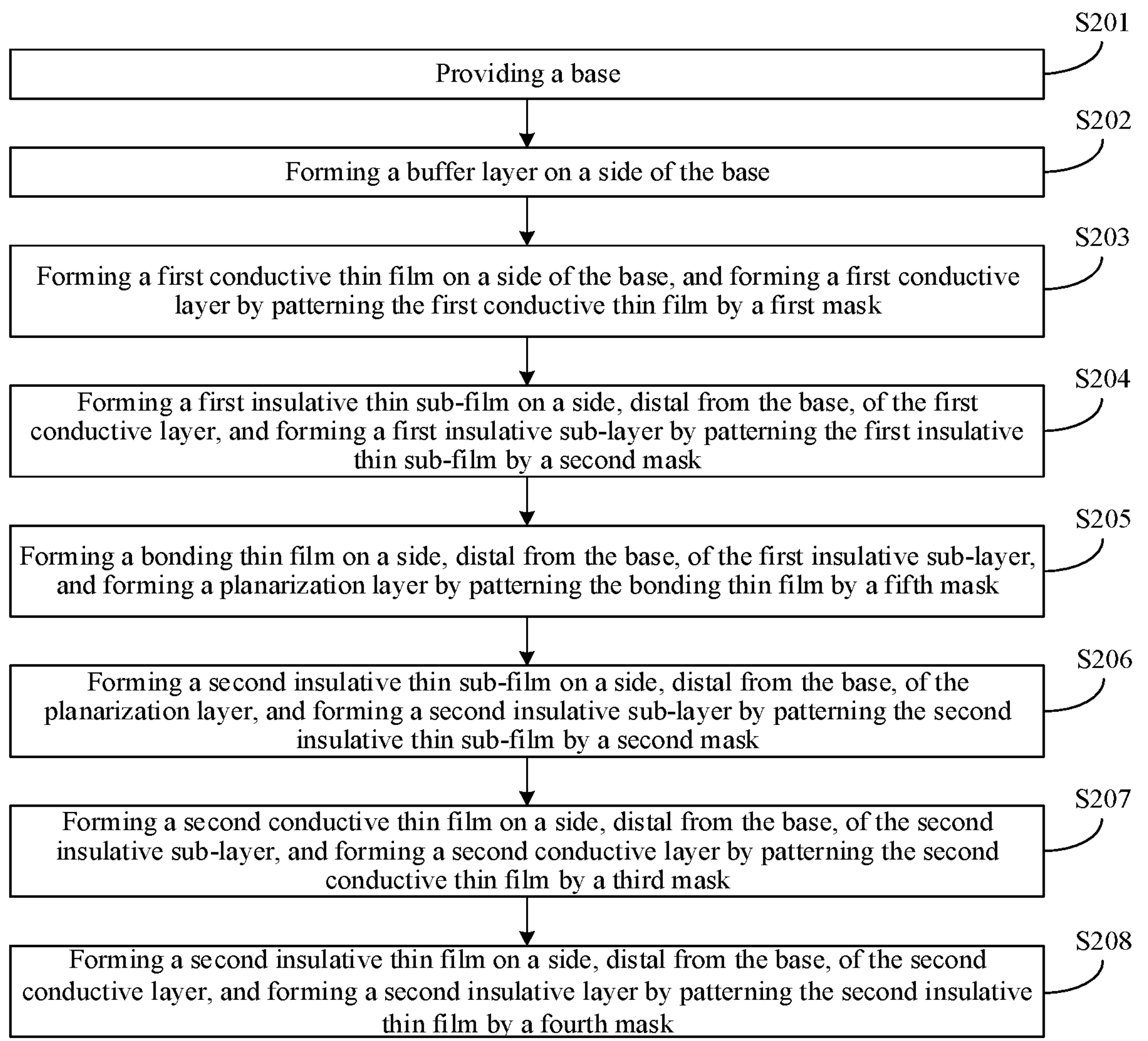
FIG. 17 is a flow chart of another method for preparing a wiring substrate according to some embodiments of the present disclosure.

FIG. 17 is a flow chart of another method for preparing a wiring substrate according to some embodiments of the present disclosure. The method is applicable to preparing the wiring substrate in the above embodiments. Referring to FIG. 17, the method includes the following processes.

In S201, a base is provided.

In the embodiments of the present disclosure, the detailed process of S201 can be referred to the detailed description of the above S101, which is not repeated in the embodiments of the present disclosure.

In S202, a buffer layer is formed on a side of the base.

In the embodiments of the present disclosure, a buffer layer is formed on the side of the base by magnetron sputtering. The buffer layer is configured to reduce a stress on the base in subsequent process of forming the first conductive layer and the second conductive layer, such that the impurity in the base is prevented from unfavorably affect the conductive property of the subsequently formed first conductive layer and the second conductive layer. A material of the buffer later is any suitable material, such as, silicon nitride (SiN), silicon oxide (SiO), or at least one of silicon nitride ((SiON)).

In S203, a first conductive thin film is formed on a side of the base, and a first conductive layer is formed by patterning the first conductive thin film by a first mask.

In the embodiments of the present disclosure, the detailed process of S203 can be referred to the detailed description of the above S102, which is not repeated in the embodiments of the present disclosure.

In S204, a first insulative thin sub-film is formed on a side, distal from the base, of the first conductive layer, and a first insulative sub-layer is formed by patterning the first insulative thin sub-film by a second mask.

The first insulative thin sub-film is formed on the side, distal from the base, of the first conductive layer by magnetron sputtering, and the first insulative sub-layer is formed by patterning the first insulative thin sub-film by the second mask. The first insulative sub-layer is disposed in the functional region, the connecting region, and the bonding region, and a first via is defined in a portion, in the connecting region, of the first insulative sub-layer and is configured to expose the first conductive layer.

In some embodiments, a material of the first insulative sub-layer is an inorganic material, for example, at least one of silicon nitride, silicon oxide, or at least one of silicon nitride.

In S205, a bonding thin film is formed on a side, distal from the base, of the first insulative sub-layer, and a planarization layer is formed by patterning the bonding thin film by a fifth mask.

In the embodiments, a material of the planarization layer is an organic resin, for example, a negative photoresist. In some embodiments, the planarization layer is disposed in the functional region, the connecting region, and the bonding region. In some embodiments, a second via is defined in a portion, in the connecting region, of the planarization layer, an orthogonal projection of the second via on the base is at least partially overlapped with an orthogonal projection of the first via on the base, and the second via is configured to expose the first conductive layer. In some embodiments, the planarization layer is only disposed in the functional region.

In some embodiments, a thickness of the planarization layer is great, for example, ranges from 7.5 μm±0.75 μm, that is, 6.75 μm to 8.25 μm. A thicker planarization layer is configured to wrap up particles between the first conductive layer and the second conductive layer to avoid break between the first conductive layer and the second conductive layer caused by piercing of the particles on the first conductive layer and the second conductive layer. In addition, the planarization layer functions as planarization.

In S206, a second insulative thin sub-film is formed on a side, distal from the base, of the planarization layer, and a second insulative sub-layer is formed by patterning the second insulative thin sub-film by the second mask.

The second insulative thin sub-film is formed on the side, distal from the base, of the planarization layer by magnetron sputtering, and the second insulative sub-layer is formed by patterning the second insulative thin sub-film by the second mask. The second insulative sub-layer is disposed in the functional region, the connecting region, and the bonding region, and a second via is defined in a portion, in the connecting region, of the second insulative sub-layer and is configured to expose the first conductive layer.

In some embodiments, a material of the second insulative sub-layer is an inorganic material, for example, silicon nitride, silicon oxide, or at least one of silicon nitride.

In S207, a second conductive thin film is formed on a side, distal from the base, of the first insulative layer, and a second conductive layer is formed by patterning the second conductive thin film by a third mask.

In the embodiments of the present disclosure, the detailed process of S207 can be referred to the detailed description of the above S104, which is not repeated in the embodiments of the present disclosure.

In S208, a second insulative thin film is formed on a side, distal from the base, of the second conductive layer, and a second insulative layer is formed by patterning the second insulative thin film by a fourth mask.

In the embodiments of the present disclosure, the detailed process of S208 can be referred to the detailed description of the above S105, which is not repeated in the embodiments of the present disclosure.

In the embodiments of the present disclosure, less masks are used to prepare the wiring substrate, and a number of the masks required in forming preparing method in the embodiments of the present disclosure is less, and thus the manufacturing process is simple and the producing cost is less.

In the embodiments of the present disclosure, as the first insulative layer is disposed in the functional region, the connecting region, and the bonding region, in etching the first insulative thin sub-film and the second insulative thin sub-film, a portion, in the connecting region, of the first insulative thin sub-film is etched to form the first sub via, a portion, in the connecting region, of the second insulative thin sub-film is etched to form the first sub via, and a portion, in the bonding region, of the second insulative thin sub-film is not required to be entirely etched. Thus, the base is not etched even if the over-etching is performed, such that the flatness of the surface of the base is ensured. Furthermore, the second conductive layer is disposed on a flat surface on a side, distal from the base, of the first insulative layer, such that in forming the second conductive layer, the partial material of the film layer on a side, proximal to the base, of the second conductive layer is avoided to be etched by the etching solution, and the undercut structure of the second conductive layer is avoided, and the second insulative layer is not broken at the connecting position having a height difference of the second insulative layer and the second conductive layer. In forming the nickel-gold layer, the abnormal growth of the specific metal does not occur at the boundary, in the connecting region, of the second conductive layer, the yield of the wiring substrate is great, and the display effect of the display effect is great.

In summary, a method for preparing a wiring substrate is provided in the embodiments of the present disclosure. The first insulative layer in the wiring substrate is disposed in the functional region, the connecting region, and the bonding region. As such, in forming the first insulative layer by etching the first insulative thin film, the portion, in the connecting region, of the first insulative thin film is etched to form the first via, and the portion, in the bonding region, of the first insulative thin film does not require to be entirely etched. Furthermore, the second conductive layer is disposed on the flat surface on the side, distal from the base, of the first insulative layer, such that the undercut structure of the second conductive layer is avoided, the second insulative layer is avoided to be broken at the connecting position having a height difference of the second insulative layer and the second conductive layer, and the abnormal growth of the specific metal is avoided at the boundary, in the connecting region, of the second conductive layer. Thus, the yield of the wiring substrate is great, and the display effect of the display effect is great.

Figure 18:
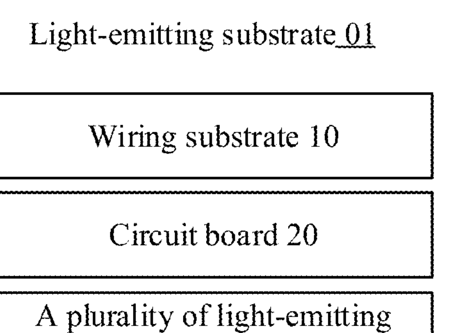
FIG. 18 is a block diagram of a light-emitting substrate according to some embodiments of the present disclosure.

FIG. 18 is a block diagram of a light-emitting substrate according to some embodiments of the present disclosure. Referring to FIG. 18, it can be seen that the light-emitting substrate 01 includes a circuit board 20 in a bonding region 11*b* of a base 11, a plurality of light-emitting units 30 in a functional region 11*a* of a base 11, and the wiring substrate 10 in the above embodiments. A first conductive layer 13 in the wiring substrate 10 is connected to the plurality of light-emitting units 30, and a second conductive layer 15 in the wiring substrate 10 is connected to the circuit board 20.

In some embodiments, each light-emitting unit 30 is a light-emitting diode (LED), a mini light-emitting diode (mini LED), a micro light-emitting diode (LED). By taking the mini LED as a light-emitting unit, a high-dynamic range display is achieved. In the case that the light-emitting substrate is applied in the display device, and a contrast of the display device is efficiently improved.

The circuit board 20 is a flexible printed circuit (FPC). One end of the flexible printed circuit is connected to a printed circuit board (PCB), and the other end of the flexible printed circuit is connected to the bonding electrode on the wiring substrate 10 thorough a chip on film (COF). A control signal on the driving integrated chip (IC) on the printed circuit board is transmitted to the bonding electrode through the flexible printed circuit. The functional electrode is in lap with the bonding electrode, and is electrically connected to the light-emitting unit 30. Thus, the control signal is transmitted to the light-emitting unit 30 through the bonding electrode and the functional electrode to control the light-emitting unit 30 to emit light.

The light-emitting substrate 01 in the embodiments of the present disclosure has the same technical effects as the wiring substrate in the above embodiments of the present disclosure, and thus, the technical effects are not repeated herein for clarity.

Figure 19:
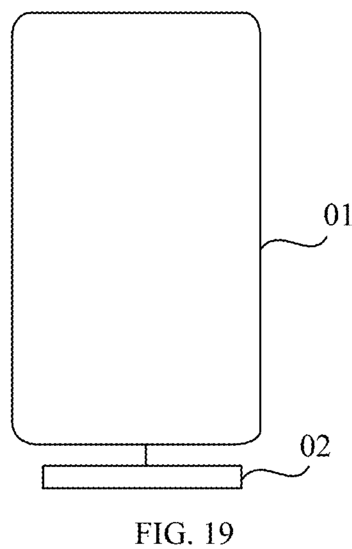
FIG. 19 is a block diagram of a display device according to some embodiments of the present disclosure.

FIG. 19 is a block diagram of a display device according to some embodiments of the present disclosure. Referring to FIG. 19, the display device includes: a power supply assembly 02 and the light-emitting substrate 01 in the above embodiments. The power supply assembly 02 is configured to supply power to the light-emitting substrate 01.

In some embodiments, the display device is a liquid crystal display device including a liquid crystal panel and a backlight source on a non-display side of the liquid crystal panel. The backlight source includes the wiring substrate in the above embodiments, for example, for achieving high dynamic range (HDR) dimming for display of operations. The liquid crystal display device has more uniform back light luminance and greater display contrast. The display device is any suitable display device, including but not limited to a mobile phone, a tablet, a television, a monitor, a laptop computer, a digital photo frame, a navigator, an e-book, and any other products or assemblies with display functions.

As the display device has the same technical effects as the wiring substrate in the above embodiments, the technical effects are not repeated herein for clarity.

It should be understood that although the terms "first" and "second" may be used herein to describe various assemblies, parts, regions, layers, and/or portions, these assemblies, parts, regions, layers, and/or portions should not be limited by these terms. These terms are only used to distinguish one assembly, part, region, layer, and/or portion from another. Therefore, the first element, assembly, region, layer, portion discussed above may be referred to as the second element, assembly, region, layer, portion without deviating from the teachings of the present disclosure.

The terms "under," "above," "left," "right," and other spatial relative terms may be used in herein for ease of description of the relationship of one assembly or feature illustrated in the drawings to another (some) assembly or feature. It should be understood that these spatial relative terms are intended to cover various orientations of devices in use or operation other than those illustrated in the drawings. For example, in the case that the device in the drawings is flipped, the assembly described as "under other assemblies or features" is oriented as "above other assemblies or features." Thus, the exemplary term "under" can include the orientations described by "under," "above." Devices can be oriented in other ways (rotated by 90 degrees or in other orientations) and the spatial relative descriptors used herein are interpreted accordingly. It should also be understood that when a layer is described to be "between two layers", the layer can be the only layer between the two layers, or one or more intermediate layers exist.

The terms used herein are only for the purpose of describing specific embodiments and are not intended to limit the present disclosure. As used herein, the singular form terms "one," "a" and "the" are intended to include the plural form, unless clearly indicated otherwise in the context. It should be further understood that the terms "include" and/or "comprise" used in the specification specify the presence of the features, wholes, steps, operations, assemblies, and/or components, but bot not exclude the presence or addition of one or more other features, wholes, steps, operations, assemblies, parts and/or groups thereof. As used herein, the term "and/or" includes any and all combinations of one or more of the associated items. In the specification, the specific features, structures, materials, or features may be combined in a suitable manner in any one or more embodiments or examples. In addition, without contradiction, persons skilled in the art may integrate and combine various embodiments or examples described in the specification and the features of various embodiments or examples.

Unless otherwise defined, terms (including technical or scientific terms) used herein shall have the same meaning understood by persons of ordinary skill in the art to which the present disclosure belongs. It should be understood that the terms defined in commonly used dictionaries should be interpreted to have meanings consistent with the meanings in the related art and/or in the context of the specification, and will not be interpreted in an idealized or overly formal sense, unless explicitly defined herein.

Described above are merely optional embodiments of the present disclosure, and are not intended to limit the present disclosure. Any modifications, equivalent replacements, improvements and the like made within the spirit and principles of the present disclosure should be encompassed within the scope of protection of the present disclosure.

The invention claimed is:

1. A wiring substrate, comprising:

a base, comprising a functional region, a bonding region, and a connecting region between the functional region and the bonding region;

a first conductive layer, disposed on a side of the base and in the functional region and the connecting region;

a first insulative layer, disposed on a side, distal from the base, of the first conductive layer and in the functional region, the connecting region, and the bonding region, wherein a first via is defined in a portion, disposed in the connecting region, of the first insulative layer and is configured to expose the first conductive layer;

a second conductive layer, disposed on a side, distal from the base, of the first insulative layer and in the connecting region and the bonding region, and electrically connected to the first conductive layer via the first via; and a second insulative layer, disposed on a side, distal from the base, of the second conductive layer and in the connecting region and the functional region.

2. The wiring substrate according to claim 1, further comprising: a buffer layer, wherein the buffer layer is disposed between the base and the first conductive layer.

3. The wiring substrate according to claim 1, wherein the first insulative layer comprises a first insulative sub-layer and a second insulative sub-layer that are sequentially laminated along a direction away from the base, the first via comprises a first sub via in the first insulative sub-layer and a second sub via in the second insulative sub-layer, and the second conductive layer is electrically connected to the first conductive layer via the first sub via and the second sub via.

4. The wiring substrate according to claim 3, further comprising: a planarization layer between the first insulative sub-layer and the second insulative sub-layer, wherein the planarization layer is disposed in the functional region, the connecting region, and the bonding region, and a second via is defined in a portion, disposed in the connecting region, of the planarization layer; wherein the first sub via, the second via, and the second sub via are configured to expose the first conductive layer, the second conductive layer is electrically connected to the first conductive layer via the first sub via, the second via, and the second sub via.

5. The wiring substrate according to claim 3, further comprising: a planarization layer between the first insulative sub-layer and the second insulative sub-layer, wherein the planarization layer is disposed in the functional region, and is not disposed in the connecting region and the bonding region.

6. The wiring substrate according to claim 1, wherein the first conductive layer comprises a plurality of functional electrodes, and the second conductive layer comprises a plurality of bonding electrodes extending along a first direction and arranged along a second direction, wherein the first direction is an arrangement direction of the functional region, the connecting region, and the bonding region, and the second direction is intersected with the first direction, and an end, proximal to the functional region in the first direction, of each of the plurality of bonding electrodes is electrically connected to an end, proximal to the bonding region in the first direction, of each of the plurality of functional electrodes via the first via.

7. The wiring substrate according to claim 6, wherein the first insulative layer comprises a target face facing away from the base, wherein a distance between a portion, in the bonding electrode in the bonding region, of the target face and the base is equal to a distance between a portion, other than the portion in the bonding electrode in the bonding region, of the target face and the base.

8. The wiring substrate according to claim 6, wherein the end, proximal to the bonding region in the first direction, of each of the plurality of functional electrodes is electrically connected to ends, proximal to the functional region in the first direction, of one or more bonding electrodes.

9. The wiring substrate according to claim 6, wherein the second conductive layer further comprises at least one dummy bonding electrode extending along the first direction, wherein the at least one dummy bonding electrode and the plurality of bonding electrodes are arranged along the second direction, and each of the at least one dummy bonding electrode is not electrically connected to the plurality of functional electrodes.

10. A method for preparing a wiring substrate, comprising:

providing a base, wherein the base comprises a functional region, a bonding region, and a connecting region between the functional region and the bonding region;

forming a first conductive thin film on a side of the base, and forming a first conductive layer by patterning the first conductive thin film by a first mask, wherein the first conductive layer is disposed in the functional region and the connecting region;

forming a first insulative thin film on a side, distal from the base, of the first conductive layer, and forming a first insulative layer by patterning the first insulative thin film by a second mask, wherein the first insulative layer is disposed in the functional region, the connecting region, and the bonding region, wherein a first via is defined in a portion, disposed in the connecting region, of the insulative layer and is configured to expose the first conductive layer;

forming a second conductive thin film on a side, distal from the base, of the first conductive layer, and forming a second conductive layer by patterning the second conductive thin film by a third mask, wherein the second conductive layer is disposed in the connecting region and the bonding region, and is electrically connected to the first conductive layer via the first via; and forming a second insulative thin film on a side, distal from the base, of the second conductive layer, and forming a second insulative layer by patterning the second insulative thin film by a fourth mask, wherein the second insulative layer is disposed in the connecting region and the functional region.

11. The preparation method according to claim 10, wherein forming the first insulative layer comprises:

forming a first insulative thin sub-film on the side, distal from the base, of the first conductive layer, and forming a first insulative sub-layer by patterning the first insulative thin sub-film by the second mask, wherein the first insulative sub-layer is disposed in the functional region, the connecting region, and the bonding region, wherein a first sub via is defined in a portion, disposed in the connecting region, of the first insulative sub-layer; and forming a second insulative thin sub-film on a side, distal from the base, of the first insulative thin sub-film, and forming a second insulative sub-layer by patterning the second insulative thin sub-film by the second mask, wherein the second insulative sub-layer is disposed in the functional region, the connecting region, and the bonding region, wherein a second sub via is defined in a portion, disposed in the connecting region, of the second insulative sub-layer, and an orthogonal projection of the second sub via on the base is at least partially overlapped with an orthogonal projection of the first sub via on the base.

12. The preparation method according to claim 11, wherein upon forming the first insulative sub-layer and prior to forming the second insulative sub-layer, the method further comprises:

forming a bonding thin film on a side, distal from the base, of the first insulative sub-layer, and forming a planarization layer by patterning the bonding thin film by a fifth mask, wherein the planarization layer is disposed in the functional region, the connecting region, and the bonding region, and a second via is defined in a portion, disposed in the connecting region, of the planarization layer; wherein the first sub via, the second via, and the second sub via are configured to expose the first conductive layer, the second conductive layer is electrically connected to the first conductive layer via the first sub via, the second via, and the second sub via.

13. The preparation method according to claim 11, wherein upon forming the first insulative sub-layer and prior to forming the second insulative sub-layer, the method further comprises:

forming a bonding thin film on a side, distal from the base, of the first insulative sub-layer, and forming a planarization layer by patterning the bonding thin film by a fifth mask, wherein the planarization layer is disposed in the functional region, and is not disposed in the connecting region and the bonding region.

14. A light-emitting substrate, comprising: a circuit board in a bonding region of a base, a plurality of light-emitting units in a functional region of a base, and a wiring substrate, wherein the wiring substrate comprises:

a base, comprising a functional region, a bonding region, and a connecting region between the functional region and the bonding region;

a first conductive layer, wherein the first conductive layer is disposed on a side of the base and in the functional region and the connecting region, and the first conductive layer is connected to the plurality of light-emitting units;

a first insulative layer, disposed on a side, distal from the base, of the first conductive layer and in the functional region, the connecting region, and the bonding region, wherein a first via is defined in a portion, disposed in the connecting region, of the first insulative layer and is configured to expose the first conductive layer;

a second conductive layer, wherein the second conductive layer is disposed on a side, distal from the base, of the first insulative layer and in the connecting region and the bonding region, and electrically connected to the first conductive layer via the first via, and the second conductive layer is connected to the circuit board; and a second insulative layer, disposed on a side, distal from the base, of the second conductive layer and in the connecting region and the functional region.

15. A display device, comprising: a power supply assembly and the light-emitting substrate as defined in claim 14, wherein the power supply assembly is configured to supply power to the light-emitting substrate.

16. The light-emitting substrate according to claim 14, wherein the first insulative layer comprises a first insulative sub-layer and a second insulative sub-layer that are sequentially laminated along a direction away from the base, the first via comprises a first sub via in the first insulative sub-layer and a second sub via in the second insulative sub-layer, and the second conductive layer is electrically connected to the first conductive layer via the first sub via and the second sub via.

17. The light-emitting substrate according to claim 16, wherein the wiring substrate further comprises: a planarization layer between the first insulative sub-layer and the second insulative sub-layer, wherein the planarization layer is disposed in the functional region, the connecting region, and the bonding region, and a second via is defined in a portion, disposed in the connecting region, of the planarization layer; wherein the first sub via, the second via, and the second sub via are configured to expose the first conductive layer, the second conductive layer is electrically connected to the first conductive layer via the first sub via, the second via, and the second sub via.

18. The light-emitting substrate according to claim 16, wherein the wiring substrate further comprises: a planarization layer between the first insulative sub-layer and the second insulative sub-layer, wherein the planarization layer is disposed in the functional region, and is not disposed in the connecting region and the bonding region.

19. The light-emitting substrate according to claim 14, wherein the first conductive layer comprises a plurality of functional electrodes, and the second conductive layer comprises a plurality of bonding electrodes extending along a first direction and arranged along a second direction, wherein the first direction is an arrangement direction of the functional region, the connecting region, and the bonding region, and the second direction is intersected with the first direction, and an end, proximal to the functional region in the first direction, of each of the plurality of bonding electrodes is electrically connected to an end, proximal to the bonding region in the first direction, of each of the plurality of functional electrodes via the first via.

20. The light-emitting substrate according to claim 19, wherein the first insulative layer comprises a target face facing away from the base, wherein a distance between a portion, in the bonding electrode in the bonding region, of the target face and the base is equal to a distance between a portion, other than the portion in the bonding electrode in the bonding region, of the target face and the base.

* * * * *